United States Patent [19]
Bowman et al.

[11] 4,068,226
[45] Jan. 10, 1978

[54] APPARATUS AND METHOD FOR DATA ENTRY AND DISPLAY

[75] Inventors: Robert A. Bowman; Mark M. Burd, both of San Jose, Calif.

[73] Assignee: International Business Machines Corporation, Armonk, N.Y.

[21] Appl. No.: 585,640

[22] Filed: June 10, 1975

[51] Int. Cl.² ............................................. G06K 15/18
[52] U.S. Cl. .................................... 340/336; 340/337; 340/365 E
[58] Field of Search ................... 340/336, 337, 365 R, 340/365 E, 365 S

[56] References Cited
U.S. PATENT DOCUMENTS

| | | | |
|---|---|---|---|
| 3,340,524 | 9/1967 | Rinaldi | 340/324 M |
| 3,617,711 | 11/1971 | Smyth | 340/365 R |
| 3,755,806 | 8/1973 | Bunting | 340/336 |
| 3,834,616 | 9/1974 | Washizuka et al. | 340/365 S |
| 3,902,054 | 8/1975 | Cochran et al. | 340/365 S |
| 3,911,424 | 10/1975 | Giannuzzi et al. | 340/365 R |
| 3,920,926 | 11/1975 | Lenaerts et al. | 340/365 E |

*Primary Examiner*—David L. Trafton
*Attorney, Agent, or Firm*—Shelley M. Beckstrand

[57] ABSTRACT

Data entered at a matrix keyboard or from a remote computer is loaded into a display buffer area of a random access storage device. Data is displayed by sequentially refreshing a plurality of display elements from a one character display buffer, loaded from the storage device under control of a display address counter. Data storage and data retrieval for display is multiplexed, with data retrieval being synchronous with respect to a system clock, and data loading being asynchronous from the keyboard. A control counter, synchronously driven by the system clock, is decoded to scan the keyboard for data entry and to gate the one character display buffer to the next sequential display element to be refreshed. Initial correspondence between the display gating and the display address counter is established, which correspondence is asynchronously stepped by entry of another character from the keyboard, so that the most recently entered character appears at the rightmost position of the display.

9 Claims, 5 Drawing Figures

APPARATUS AND METHOD FOR DATA ENTRY AND DISPLAY

BACKGROUND OF THE INVENTION

1. Field of the Invention

This invention relates to data processing systems. Data entered from a keyboard or other device is stored and continuously retrieved for display refreshing.

2. Description of the Prior Art

Terminal systems in today's data processing industry require remote terminals providing a keyboard for entering data, and a display for displaying data entered at the keyboard or communicated to the terminal from a remote processor or other terminal.

The functions provided and the cost of such terminals often determines their success in the marketplace, and that cost/function ratio is critically determined by the complexity and quantity of the logic components.

Various keyboard functions, such as N key lockout, two key rollover, and trailing and leading edge debounce are known in the prior art; as are display functions including the right justification of entered data, with the most recently entered character displayed at the rightmost position.

The prior art circuitry for providing these functions includes integrators on the key contacts for bounce protection, shift registers for providing key rollover protection, other shift registers for display refresh, and so forth.

The art is in need, therefore, of a simple circuit providing a wide range of keyboard protection features and display power-- which is efficient of hardware and which is, therefore, capable of packaging on a single integrated circuit chip to achieve optimum cost.

SUMMARY OF THE INVENTION

The data entry and display system of the invention includes a random access storage device having a plurality of addressable data storage locations. Display counter means, synchronously driven by a system clock, addresses storage to sequentially retrieve display refresh data. Load counter means, asynchronously driven by operation of the keyboard, or by some remote data source, addresses data into the storage device. Addressing of storage is multiplexed between the load and display counters, and the synchronous relationship between the system clock and the display counter is stepped asynchronously with the loading of a data character into storage.

Control counter means, synchronously driven by the system clock, is decoded to scan the key locations of a matrix keyboard and to gate the retrieved display refresh data to sequential display positions. Control counter contents are complemented and loaded into the display counter when the storage device and load counter are reset to initialize the display gating and display refresh data retrieval synchronization.

Key scanning means, upon sensing an operated keyswitch at a matrix position corresponding to the control counter contents, loads the contents of the control counter into a counter buffer means. The counter buffer contents are loaded into storage at the location addressed by the load counter if the control counter and the counter buffer compare equal when an operated keyswitch is again scanned. The counter buffer is reset when the control counter and counter buffer compare equal, and the corresponding key switch is no longer operated. Thus, two key rollover, N key lockout, and leading and trailing edge bounce protection are provided by the cooperative operation of the counter buffer means and the key scanning means.

The foregoing and other objects, features and advantages of the invention will be apparent from the following more particular description of preferred embodiments of the invention, as illustrated in the accompanying drawings.

DETAILED DESCRIPTION

In an exemplary embodiment of the invention, a keyboard may comprise ten numeric and six function keys arranged in a 4 × 4 matrix. When a numeric key is depressed, its code is entered into the keyboard portion of a random access memory (RAM) buffer and is also entered into the display portion of the RAM buffer and displayed on the digital display. Herein, when a function key is depressed, its code is entered into the keyboard portion of the RAM buffer. Additionally, the digital display may be cleared and a signal transmitted to the host.

When a single key is depressed, its code will be loaded into the keyboard portion of the RAM buffer. If two keys are depressed sequentially and released in the same order of depression, the second key depressed will be loaded into the buffer when the first key is released.

A terminal control adapter may, after establishing communication with the host, transmit keyboard characters thereto from the RAM buffer. If the keyboard portion of the RAM buffer is full when another key is depressed, an overflow condition occurs resulting in the keyboard being electronically locked.

Depression of a "send" key normally causes a terminal in idle state to request serivces of the host. If previous keys were depressed, they are stored in the RAM—not to be transmitted to the host until depression of the send key and response from the host to the resulting request for attention.

In the exemplary embodiment of the invention, the digital display may comprise eight seven segment light emitting diodes (LED's), aligned in a horizontal grouping. The display is operated in a strobed (multiplex) mode of operation using a portion of RAM as a refresh buffer.

Data entered from the numeric keyboard is entered in the digital display buffer in the same sequence as the keyboard buffer. The display logic inserts the first character received from the keyboard in the rightmost position of the display. As each subsequent key is depressed, the previous character or characters in the display are stepped one position to the left. After the display is full, herein 8 characters, subsequent characters entered from the keyboard continue to enter the right hand position of the display, causing the leftmost character to roll off the display. This rolling off need have no effect on the character being stored in the keyboard buffer.

Data will remain in the display until either cleared by depression of one of the function keys or until reset by a command from the host.

Data from the host to be displayed is handled in the same way as keyboard data. An appropriate command from the host causes the display to be cleared, and conditions it to receive up to eight characters — which are loaded in the proper sequence under control of the host into the display buffer portion of RAM.

Figure 1:
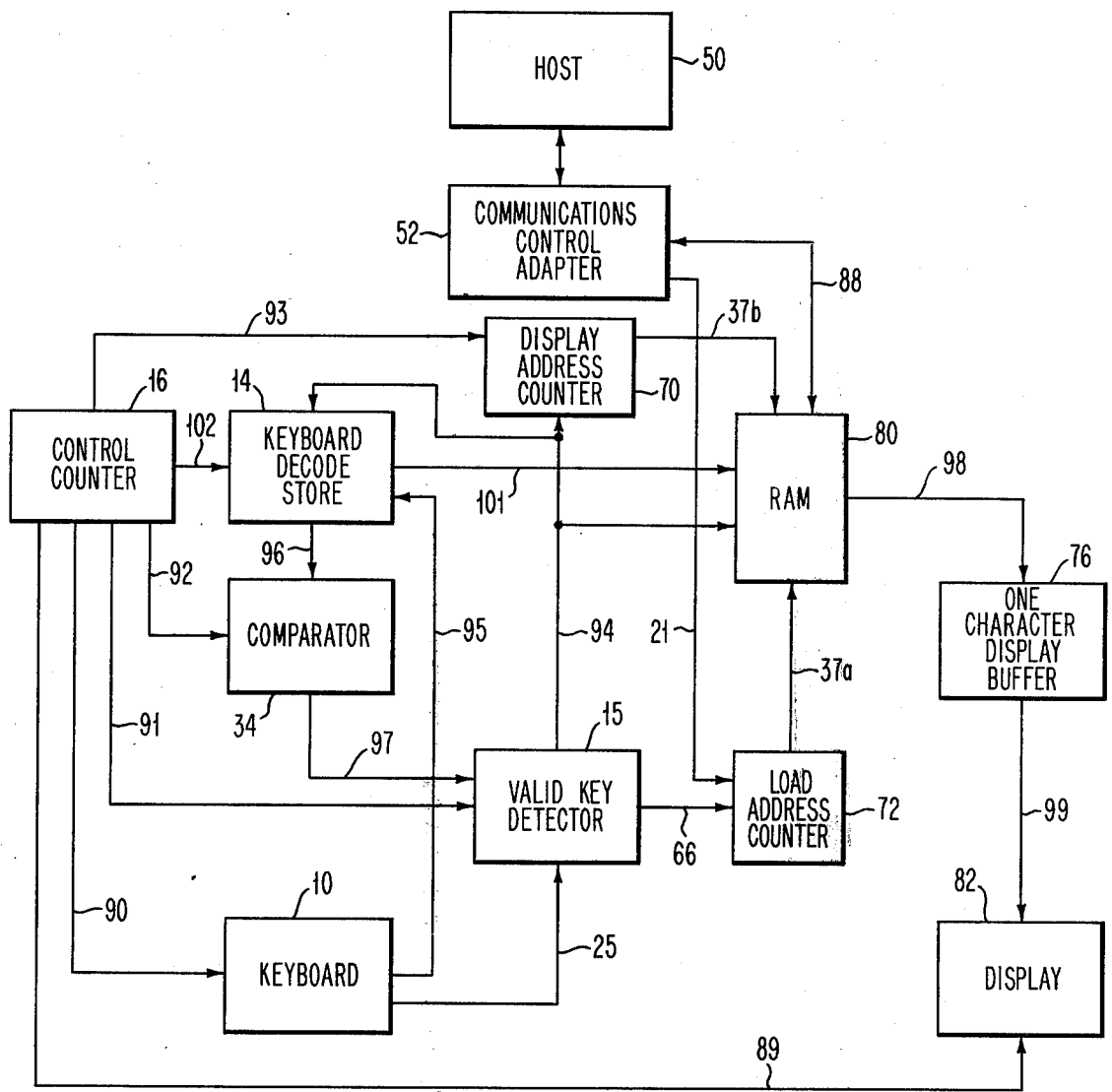
FIG. 1 is a diagrammatic illustration of the functional relationships of the various components of a preferred embodiment of the invention.

Referring now to FIG. 1, a description will be given of a preferred embodiment of the invention. In the course of this description, it will become apparent how data entered at keyboard 10 or communicated from host 50 is loaded into RAM storage 80 for subsequent display at display 82.

Control counter 16 is driven by clock 40 (See FIG. 3) and its output decoded to a plurality of sequential timing stress. These states will be more fully described in connection with FIG. 5. The timing states developed by counter 16 are fed along lines 89 to display 82, lines 90 to keyboard 10, lines 91 to valid key detector 15, lines 92 to comparator 34, lines 93 to display address counter 70, and lines 102 to keyboard decode store 14. The manner in which these timing states control the various circuits which they feed will be described in greater detail hereinafter.

Keyboard decode store 14 stores the contents of counter 16 as communicated along lines 102, and transfers its contents to RAM 80 along line 101 under certain conditions including a signal on line 95 from keyboard 10. The contents of keyboard decode store 14 are also fed along line 96 to comparator 34, which provides an output on line 97 when lines 92 and 96 are equal. Valid key detector 15 is responsive to the output of comparator 34 along line 97, and of control counter 16 along line 91, and of keyboard 10 along line 25 for signaling along lines 94 and 66 the finding of a valid closed or operated key in keyboard 10, thereby controlling the loading of data from keyboard decode store 14 into RAM 80 along line 101. Load address counter 72 is responsive to signals along lines 21 from the communications control adapter 52 and from valid key detector 15 along line 66 for addressing RAM 80 along lines 37a. Data for communication from and to host 50 through communication's control adapter 52 is communicated along line 88 from RAM storage 80. Data to be displayed at display 82 is continually refreshed along lines 99 from one character display buffer 76, with the display position to be refreshed addressed by display address counter 70 along line 37b, which is synchronously driven by the system clock and initialized by control counter 16 along line 93. The character to be displayed is loaded into one character display buffer 76 along line 98 from RAM storage 80 under control of display address counter 70.

The general operation of the apparatus of FIG. 1 will be described, while a more detailed explanation of the invention will be given in connection with FIGS. 2 and 3 below. When a key is manually operated in keyboard 10, a circuit comprising control counter 16, keyboard decode store 14, comparator 34, and valid key detector 15 functions to identify that key, provide rollover and debounce protection, and, upon detecting a valid key closure, load into RAM 80 a data representation of the closed key along line 101. The location into which that data representation is loaded is under control of load address counter 72, which is incremented asynchronously under control of valid key detector 15. In a multiplexed fashion with the entry of keyboard data into RAM 80, data to be displayed is retrieved from RAM 80 under control of display address counter 70 for refreshing of display 82. As will be more fully described below, display address counter 70 continuously and synchronously with the system clock cycles through the display portion of RAM 80 to load the display buffer 76 the next character to be displayed at display 82. Also, in a manner to be described more fully below, that character will be displayed at the display position to which it is gated by control counter 16 along lines 89. The correspondence which exists between the address of the display as controlled by line 89 and the location in RAM 80 which is loaded out along line 98 under control of display address counter 70 is set or altered with the introduction into RAM 80 of an additional character from keyboard 10, or from host 50, in such a way as to provide for continuously refreshing display 82 while permitting the most recently entered character loaded into RAM 80 to be displayed at the rightmost position of display 82 without shifting display characters between storage locations in RAM 80.

Figure 2:
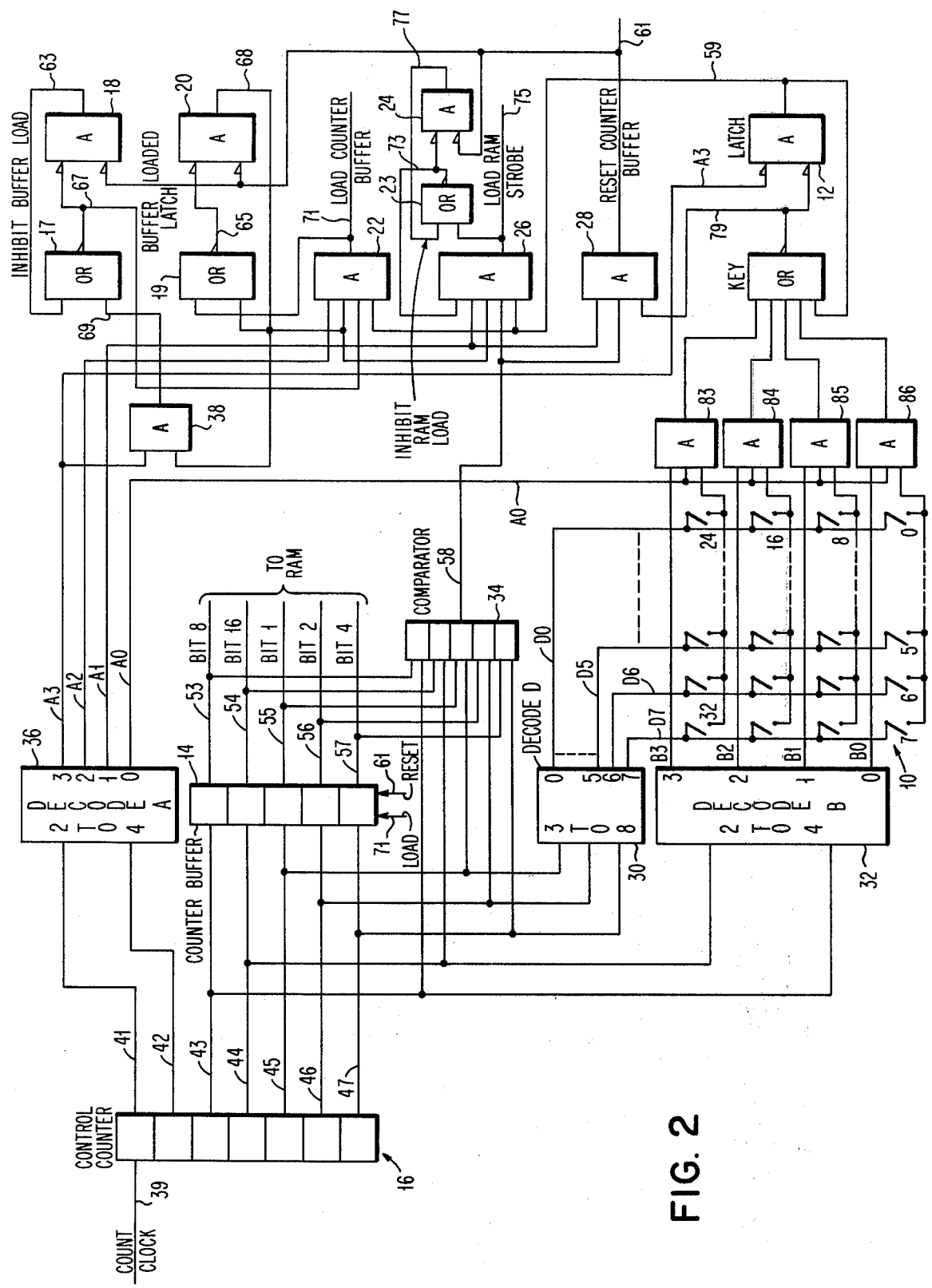
FIG. 2 is a diagrammatic illustration of the keyboard decoding aspect of the invention.

Referring now to FIG. 2, a more detailed explanation will be given of the keyboard entry subsystem of the invention, including that portion of the circuit shown in FIG. 1 including elements 16, 14, 34, 10, and 15, representing that portion of the apparatus which relates to the identification of a valid key, provision for rollover and debounce protection and the loading of a data representation of a valid operated key into RAM 80. The apparatus of FIG. 2 operates to sense the closure of a keyswitch in keyboard 10 and load a code representing that key into RAM along lines 53–57, as will be more fully described.

Figure 5:
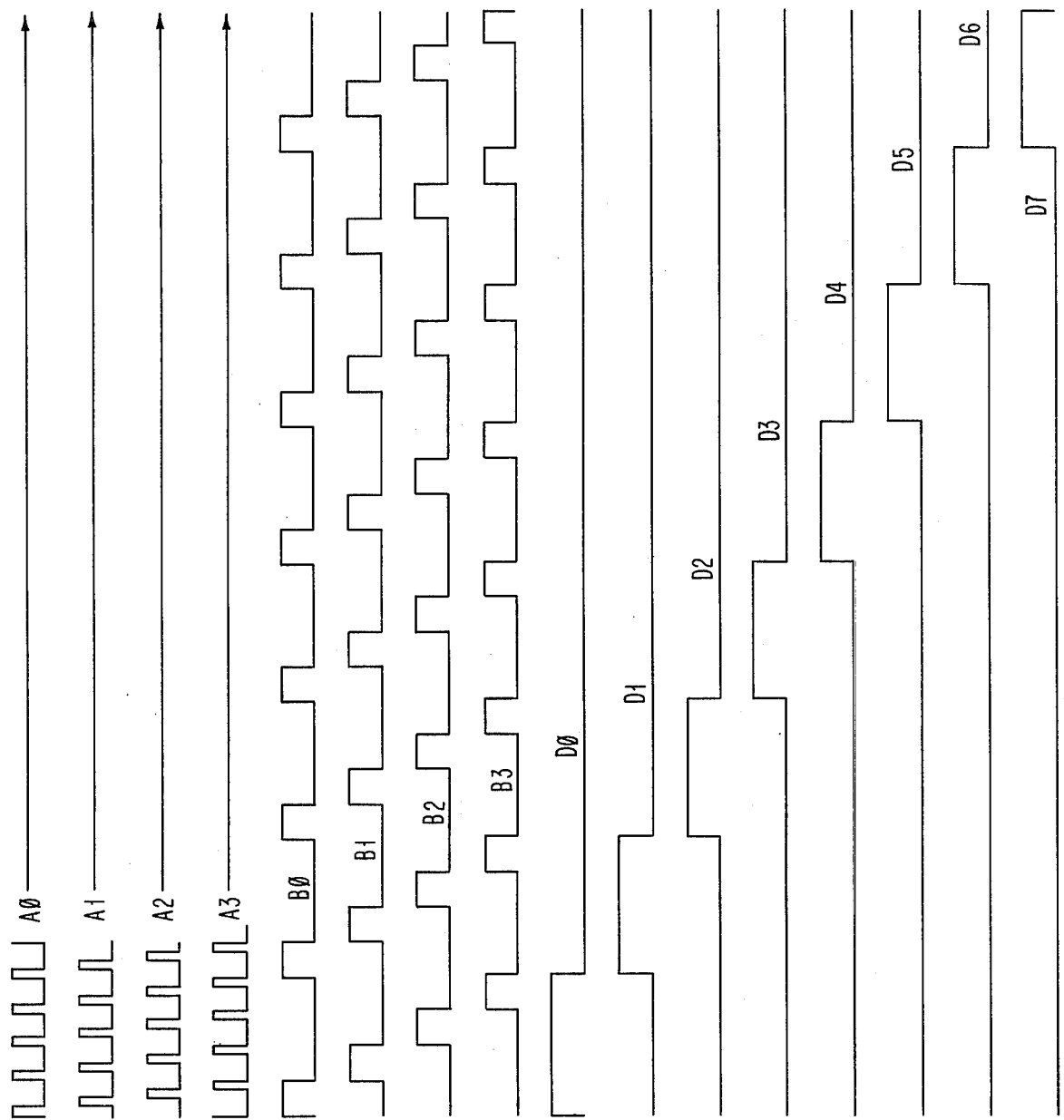
FIG. 5 is a timing chart illustrating the output states of the various control counter decoders, used for timing the keyboard decode, storage loading, and display refresh circuitry.

A system clock (not shown) provides oscillator or timing pulses along line 39 to counter 16. Herein, counter 16 is implemented with seven stages, the output of said stages being provided along lines 41–47. Counter 16 operates as a binary counter, with each clock pulse along line 39 incrementing by one its contents. The two low order stages of counter 16 are fed along lines 41 and 42 to decoder 36 the outputs of which appear on lines A0, A1, A2, A3 as illustrated in FIG. 5, showing that the two inputs on line 41, 42 are decoded to one of four outputs. The output signals appearing on lines A0-A3 control the time at which the various latches and gates operate, as will be more fully described below. Timing signal A0 is sent to AND gates 83, 84, 85, and 86. Timing signal A1 is fed to AND gates 26 and 28. Timing signal A2 is fed to AND gate 22. Timing signal A3 is sent to AND gate 38 and to AND gate 12 in the keylatch.

The five high order stages of control counter 16 are fed along lines 43–47 to counter buffer 14, comparator 34, three to eight decoder 30 and two to four decoder 32. The other inputs to counter buffer 14 are reset line 61 and load line 71, with line 61 operating to reset the contents of counter 14 to a logical zero in all stages, and a signal on load line 71 causing the setting of the five stages of the counter buffer so as to correspond to the logical states on input lines 43'47. The outputs of counter buffer 14 are fed to RAM as bits 1, 2, 4, 8, and 16 along lines 53–57 as well as to the corresponding stages of comparator 34. Comparator 34 provides an output on line 58 when each stage of the counter buffer 14 contains the same data significance as the corresponding lines 43–47; such that, lines 43 and 53 are equal, lines 44 and 54 are equal, lines 45 and 55 are equal, lines 46 and 56 are equal, and lines 47 and 57 are equal.

Keyboard 10 comprises a matrix array of key switches, shown here as having matrix positions 0–32 arranged in four rows and eight columns. The third and fourth stages of binary counter 16 are decoded by decoder 32 to successively sample the rows of the matrix by providing an output signal B0 to AND gate 86, B1 to AND gate 85, B2 to AND gate 84, B3 to AND gate 83. The high order stages at counter 16 are decoded by three to eight decoder 30 to successively sample the columns of the keyboard matrix along lines D0–D7. As will be apparent to those skilled in the art, while keyboard 10 is shown as an array of contact closure switches, any keyboard technology which allows successive sampling of the state of actuation of the key may be utilized. As diagramatically illustrated in FIG. 2, the other input to AND gate 86 is the line from keyswitch locations 0–7, to AND gate 85 from keyswitch locations 8–15, to AND gate 84 from keyswitch location 16–23, and to AND gate 83 from keyswitch locations 24–32. The timing relationship of the output of decoder 32 and of the outputs of decoder 30 are also illustrated in FIG. 5. Thus, at time A0, if keyswitch 32 is closed, AND gate 83 will provide an output at D7 and B3 times. The output of AND gates 83–86, are fed to OR gate 11 in the keylatch. The other input to OR gate 11 is the output of AND gate 12 on line 59. The output of OR gate 11, which will be negative if any input is positive, is fed along lines 79 to AND gate 12 and to AND gate 28. The output of AND gate 12 along line 59 is fed to OR gate 11, AND gate 26, and AND gate 22. The other input to AND gate 28 appears along line 58 from comparator 34, which also provides an input to AND gate 26. The output of AND gate 28 is the reset buffer counter line 61, which is fed to counter buffer 14, to AND gate 24, to AND gate 20, and to AND gate 18.

The inhibit buffer load latch comprises OR gate 17 and AND gate 18. The inputs to OR gate 17 are the output of AND gate 38 along line 69 and the output of AND gate 18 along line 63. The output of OR gate 17, which will be negative when either of lines 63 or 69 are positive, is fed along line 67 to AND gate 18, and AND gate 22. The output of AND gate 18 which will be positive when both the lines 67 and 61 are negative, is fed back to OR gate 17.

The buffer loaded latch comprises OR gate 19 and AND gate 20. The inputs to OR gate 19 are lines 68 from AND gate 20 and the load counter buffer line 71 from AND gate 22. The output of OR gate 19, which will be negative when either of lines 71 or 68 are positive, is fed along lines 65 to AND gate 20. When both of lines 65 and 61 are negative, AND gate 20 provides an output on line 68 to OR gate 19, AND gate 38, AND gate 22, and AND gate 26. Inhibit RAM load latch comprises OR gate 23 and AND gate 24. The inputs to OR gates 23 are load RAM strobe line 75 and the output of AND gate 24 along line 77. When either of lines 77 or load RAM strobe lines 75 are positive, a negative output is provided along line 73 to AND gate 26, and to AND gate 24. The output of AND gate 26 is the load RAM strobe line 75, which will cause the contents of buffer counter 14 to be loaded into RAM storage (shown in FIG. 1 and FIG. 3 as RAM 80). The output of AND gate 22 is load counter buffer line 71, which when positive loads the contents of lines 43–47 from counter 16 into the corresponding stages of counter buffer 14.

As will be apparent, the circuit of FIG. 2 provides, with an optimum utilization of logic circuits an inexpensive keyswitches, an apparatus for providing a standard set of key codes and keyboard protective features. The keyboard protective features provided are leading and trailing ege debounce, two key rollover, and N-key lockout. Some of the system benefits provided by this aspect of the invention, and as will become more apparent in connection with the description of FIG. 3, are the ability to use part of the keyboard logic as mutiplexed memory allocation times, and the ability to use part of the keyboard logic as strobe pulses for a time multiplex display.

By way of summary and further description, the logic components illustrated in the circuit of FIG. 2 include an M+N bit counter 16 where 2N is the number of keys required in keyboard 10, and M is at least 1, and preferably 2 or more, sufficiently large to make the cycle time of the M+N bit counter 16 equal to or greater than 6 milliseconds. Another logical component illustrated in FIG. 2 is the N-bit buffer 14. Also provided is an N-bit to N-bit compare circuit 34, decode circuitry 36 for M-bits, and decode circuitry 30 and 32 for X and Y bits of counter 16 where X + Y = N. As illustrated in the circuit of FIG. 2 for illustrative purposes is a keyboard that requires 32 or less keys, and where the following values are used for the variables noted above:

M = 2 (as implemented in lines 41 and 42,) N = 5 (as implemented in lines 43–47,) X = 2 (as implemented in lines 43 and 44,) and Y = 3 (as implemented in lines 45–47). The input clock appearing on line 39 for the counter 16 is the system memory allocation time.

Referring now to FIGS. 2 and 5, the operational characteristics of the circuit FIG. 2 will be described.

Each key in keyboard 10 that is depressed by the operator, independent of the number of keys depressed, will create a unique set pulse to keylatch 11, 12 when scanned by decoders 30 and 32. Each unique set pulse corresponds to a unique count in counter 16. This count is used as the key code of the depressed key that caused the unique set pulse. Keylatch 11, 12 can only be set at decode A0 time and is reset every A3 time. All actions dependent on the keylatch 11, 12 takes place at either A1 or A2 time. In this manner, keyboard action is synchronized with the logic, and glitches are eliminated.

When one or more keys are closed in keyboard 10, the first unique set pulse into AND gates 83–86 that is present at A0 time will set keylatch 11, 12. At A1 time and keylatch 11, 12 not set, counter buffer 14 will be reset (or already will have been reset.) At A2 time and keylatch 11, 12 set, counter buffer 14 will be set with the contents of the five high order bits of counter 16, and buffer loaded latch 19, 20 will be set. At A3 time and buffer loaded 19, 20 set, inhibit buffer load latch 17, 18 will be set. Inhibit buffer load latch 17, 18 will prevent the counter buffer from being loading again until it has been reset by reset buffer counter line 61. Thus, while other keys may be depressed causing the keylatch 11, 12 to set, the counter buffer 14 cannot be loaded again until reset buffer counter line 61 becomes active. This action locks the keycode for the first key detected into counter buffer 14 and causes the logic to ignore other key strokes until buffer 14 is reset. This is referred to as N-key lockout.

Referring now to AND gate 28, its output line, reset counter buffer 61, can only be active at A1 time, 5 bit compare on line 58, and keylatch 11, 12 not set. Since 5 bit compare 58 means that the contents of counter buffer 14 and the high order 5 bits of counter 16 are equal, the 5 bit compare line 34 becomes active only once for every full revolution of counter 16. If counter buffer 14 has been loaded as described above at A2 time and keylatch 11, 12 set, the first opportunity for the reset counter buffer line 61 to become active is at A1 time one full counter 16 revolution later; and if this line does not become active because the keylatch 11, 12 is set, this opportunity will occur every full counter revolution thereafter until keylatch 11, 12 is not set at 5 bit compare time on line 58.

Keylatch 11, 12 will be set if the key that caused the counter buffer 14 to be loaded is still depressed, in which case the reset counter buffer line 61 will remain inactive at A1 time and will have missed its first opportunity to reset buffer 14. This is interpreted as having seen keylatch 11, 12 set twice in a row over a period of 6.6msec., and thus the logic assumes that the first keylatch 11, 12 set was not due to electrical or mechanical noise, and that contact bounce has had sufficient time to decay, (as most inexpensive keyswitches have bounce characteistics of equal to or less than 5 milli seconds,) and therefore a valid keystroke is detected. Correspondingly at A1 time, 5 bit compared on line 58, keylatch 11, 12 set, and buffer loaded latch 19, 20 set, the circuit activates load RAM strobe 26 on line 75 indicating a valid keystroke has been made. The keycode corresponding to that key is available to be loaded into RAM from the outputs of counter 14 along lines 53-57. Thus, a unique keycode has been created for each unique key depressed with elimination of multiple keycode entries that could be caused by keyswitch leading edge bounce. Load RAM strobe 75 sets the inhibit RAM load latch 23, 24 so that successive compares do not cause multiple RAM strobes on line 75. (Thus, multiple entries into RAM 80 will not occur for a character corresponding to a key switch depressed for a time longer than a full cycle through counter 16, unless reset for typomatic operation.)

Had the keylatch 11, 12 not been set at the first opportunity for reset counter buffer line 61 to become active, the counter buffer 14, the buffer loaded latch 19, 20, and the inhibit buffer load latch 17, 18 would be reset and the load RAM strobe line 75 remains inactive. This would leave the logic in a state to act on the very next unique keylatch 11, 12 set pulse on line 59 in the same manner as initially described. This condition could occur due to electrical noise in the keyboard circuitry or excessive keyswitch bounce on actuation or release. Had keylatch 11, 12 been set at the first opportunity for reset counter buffer 28 to become active, but not set for one of the corresponding later opportunities, inhibit RAM load latch 23, 24 would be reset with the above mentioned latches at this later opportunity. The load RAM strobe line 75 would have been active once and the logic would again return to a state to act on the very next unique keylatch 11, 12 set pulse. This is the normal way in which a released valid keystoke is sensed and means that keyswitch trailing edge bounce is eliminated in the logic by the same mechanism that leading edge bounce is eliminated.

If multiple keys are depressed simultaneously (that is, within 6.6 milli seconds of each other), the first key that appears at A0 time will set keylatch 11, 12 and thus the keycode presented at load RAM strobe time 75 will be unpredictable and will depend entirely on the contents of counter 16 when the multiple key depression is made. If, however, one key is depressed and no earlier than 6.6 msec. later a second key is depressed (where the estimated fastest keying rate for trained typist is 10 msec. per key), the first key is then released and no earlier than 13.2 msec. the second key is released, both keycodes will cause load RAM strobe 75 to become active for their corresponding unique key codes. This function is described as two-key rollover.

As previously noted, A1 time is used to load keycodes into the RAM storage. A0, A1, A2, and A3 times effectively allow the multiplexing of the RAM storage. Thus, A0, A2, and A3 times are used to perform other RAM storage operations such as (1) loading keycodes from the storage into the system, (2) loading keycodes into a display refresh portion of the storage, and (3) loading system display codes into the RAM storage.

The cycle time of counter 16 has been illustrated to be somewhat longer than normal key bounce and somewhat shorter than maximum keying rate. Thus, decode time D0 through D7 pulses are active for 832 microseconds and have a period of 6.6 milli seconds. The pulses then are directly usable to strobe an 8 digit time multiplexed display such that the display will be flicker free and synchronized to the memory cycle time, as will be described in connection with FIG. 3.

Summarizing the key entry protective features of FIG. 2, 2 key rollover, N-key lockout, and leading and trailing edge bounce are provided by the operation of counter 16 and control buffer 14, and the associated control logic for distinguishing the keys scanned first, second, and subsequently. Detecting two successive scans of the same key provides leading edge bounce protection. Resetting the counter buffer after detecting that the previously scanned key is no longer closed provides trailing edge bounce protection. Thus, leading and trailing edge protection is provided by the same logic. N-key lockout is provided by loading the counter buffer with the first key detected, as the buffer cannot be reset until the control counter and the buffer compare equal and that first key is no longer operated. 2 key rollover is provided by resetting the counter buffer when the first key is detected as having been released, allowing the loading of the counter buffer with the second key detected.

Figure 3:
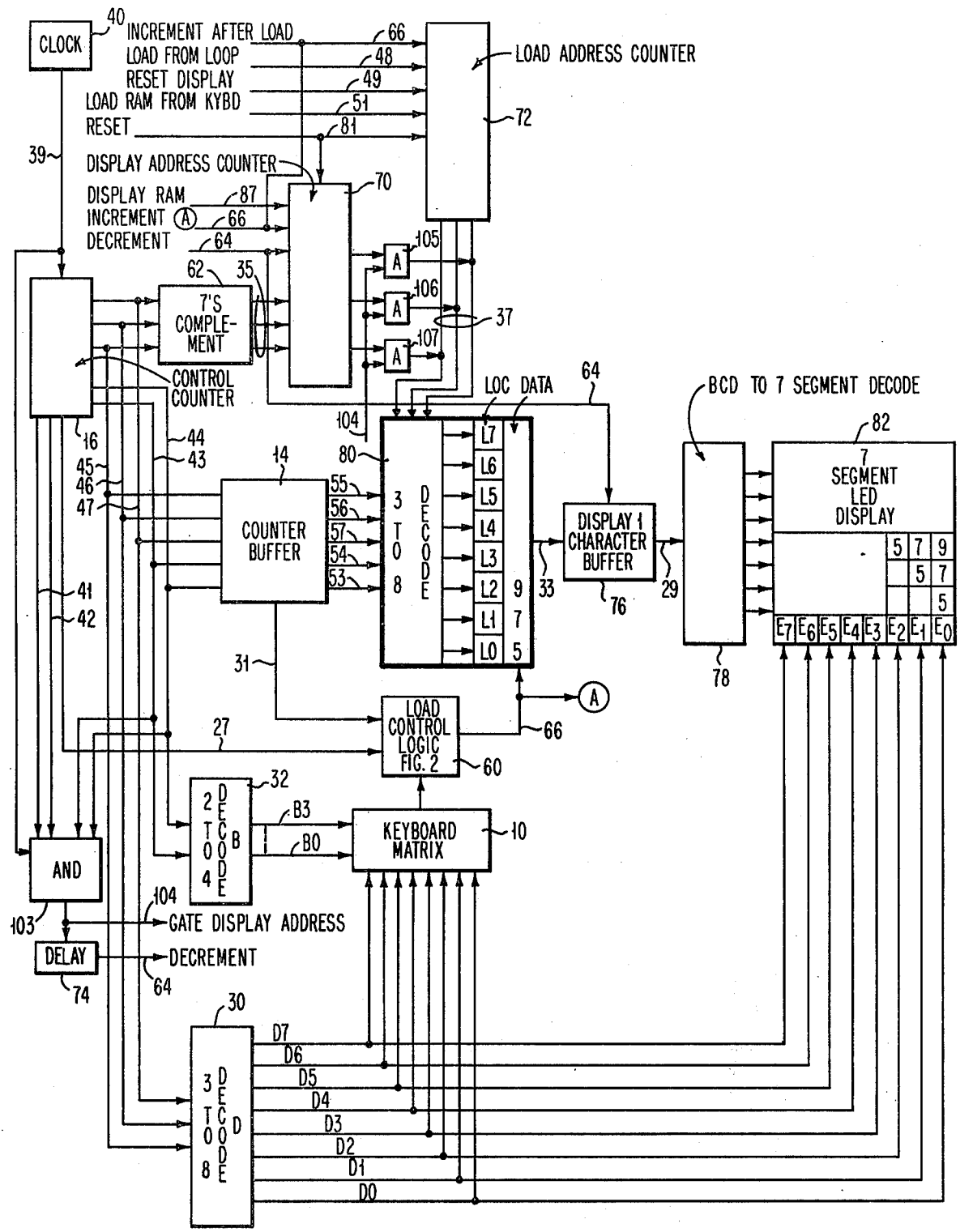
FIG. 3 is a diagrammatic illustration of the display refresh aspect of the invention.

Referring now to FIG. 3, the invention will be described with respect to the apparatus for displaying characters entered into RAM storage 80 in such a manner that the most recently entered character is displayed at the rightmost position of display 82 and all previously entered characters are displayed shifted left one position for each new character entered. As with the keyboard decode logic of FIG. 2, timing is provided throughout the circuit by control counter 16. In FIG. 3, line 27 from control counter 16 represents line 41 and 42 as shown in FIG. 2 and is fed to the load control logic 60 referring to decoder 36, and the various decode latches and gates at the rightmost section of FIG. 2. The high order 5 bits of control counter 16 appearing on lines 43-47 are fed to counter buffer 14 and to decoders 32 and 30 as described in connection with FIG. 2. In addition, lines 27 and 31 represent the input to comparator 34 as part of the load control logic 60. Further, the outputs of the third through fifth stages of counter 16 are fed along lines 45-47 to sevens complement circuit 62, the outputs of which appear as lines 35 into display address, or up/down, counter 70. System clock 40 provides an output along line 39 to control counter 16. System clock output 39, and control counter 16 outputs 41-44 are ANDed together at AND 103, output 104 of which is delayed at 74 and appears as decrement line 64 to display address counter 70. Gate display address line 104 is fed to AND gates 105, 106, 107 to gate display address counter 70 outputs 37 to RAM 80. The other inputs to display address counter 70 are an increment line 66 from load control 60, a display RAM line 87 and a reset line 81. The outputs of display address counter 70 are fed to AND gates 105-107 an thence along lines 37 to the 3 of 8 decode in RAM storage 80 and are used, as will be described below, for addressing the storage locations L0-L7 for controlling the loading of data into display character buffer 76 along line 33. A decrement signal on line 64 also gates the contents of character buffer 76 along line 29 into the BCD to 7 segment decode 78. The outputs of BCD to 7 segment decode are fed to the 7 segment LED display 82 to activate the various display segments for generating the display characters. The outputs of 2 to 4 decoder 32 and 3 to 8 decoder 30 are fed along lines D0-D7 an B0-B3 to keyboard matrix 10 as described previously in connection with FIG. 2. The outputs of decoder 30 are also fed to address or gate the display positions E0-E7 at which the character in display buffer 76 is to be displayed or in a right justified fashion without transferring the data characters between storage locations L0-L7 within buffer 80. This is accomplished by the addressing scheme utilizing display address counter 70 is conjunction with decoder 30. Initially, display address counter 70 and decoder 30 are brought into synchronization by loading the 7's complement of the contents of control counter 16 into the display address counter 70. Once initialized, the data character located in refresh buffer location L7 will be displayed during D strobe time D0 at display 82 position E0. Similarly, the data character located in refresh buffer 80 storage location L2 will be displayed at display location E5 during D strobe 30 time D5, and so fourth. The relationship between decoder 30 outputs D0-D7, display positions E0-E7, and data locations L0-L7 are set forth in the following chart showing the entry of data characters 5, 7, and 9, in that order, at keyboard matrix 10. (The display counter address locations portion should be read from right to left, and from top to bottom, in time. The display positions are shown as they would be physically viewed at the terminal display.) At reset, which in this example occurs at time D5, the seven's complement (or 2) is loaded into the display counter, which then begins decrementing under control of the system clock--with incrementing occurring with detection of each valide key, as will be explained below.

| Key Actuated | D' Strobe Display Position | D7 E7 | D6 E6 | D5 E5 | D4 E4 | D3 E3 | D2 E2 | D1 E1 | D0 E0 |
|---|---|---|---|---|---|---|---|---|---|
| | | | | Display Counter 70 Address | | | | | |
| Reset (at time D5) | | L0 | L1 | L2 | X | X | X | X | X |
| | | L0 | L1 | L2 | L3 | L4 | L5 | L6 | L7 |
| 5 | | L1 | L2 | L3/L2 | L3 | L4 | L5 | L6 | L7 |
| | | L1 | L2 | L3 | L4 | L5 | L6 | L7 | L0 |
| | | L1 | L2 | L3 | L4 | L5 | L6 | L7 | L0 |
| 7 | | L2/L1 | L2 | L3 | L4 | L5 | L6 | L7 | L0 |
| | | L2 | L3 | L4 | L5 | L6 | L7 | L0 | L1 |
| | | L2 | L3 | L4 | L5 | L6 | L7 | L0 | L1 |
| 9 | | L3 | L4 | L5 | L6 | L7 | L0 | L1/L0 | L1 |
| | | L3 | L4 | L5 | L6 | L7 | L0 | L1 | L2 | refreshed. As previously described in connection with FIG. 2, when the contents of buffer 14 compare with the high order positions of control counter 16, and the appropriate latching and gating has been accomplished to eliminate bounce and rollover, load control logic 60 will provide a signal on line 66 causing contents of buffer 14 as signaled on line 53-57 to be loaded into the storage location L0-L7 addressed by load address counter 72 as provided along line 37 in a multiplex fashion with the contents of counter 70. Load address counter 72 is incremented after such a loading by a signal on line 66. Other control lines into load address counter are load from loop line 48, reset display line 49, load RAM from keyboard 51 and reset line 81. With line 48 active, load address counter 72 will be incremented in order to load data received from a host computer 50 along line 68. With load RAM from keyboard line 51 active, data will be loaded into storage 80 from buffer 14 under control of line 66 at the address location specified by counter 72.

The operation of the apparatus in FIG. 3 will now be described in connection with the timing chart provided in FIG. 4.

Referring to FIG. 3, display counter 70 addresses locations L0-L7 in storage 80 to fetch data stored therein for display at positions E0-E7 of LED display 82 at the display position E0-E7 addressed by decoder 30. As will be apparent hereinafter, data entered into display buffer storage 80 is displayed in LED display 82

Storage location L0-L7, upon initialization, contain blank data, herein hex F, in all of its locations L0-L7 so that display 82 is being constantly refreshed to display blank characters. Display address counter 70 is continuously cycled under control and in synchronization with clock 40 along line 64.

Suppose now that the operator has keyed in data character 5 at keyboard 10, and at the very next D5 time the data character 5 will be declared valid by the keyboard logic and will be loaded into RAM 80. When line D5 comes up from decoder 30, the contents of the counter buffer will be loaded into RAM storage 80 refresh buffer location L0 inasmuch as load address counter 72 has previously been initialized to the zero address position. With data character 5 loaded into location L0 of buffer 80, an increment signal on line 66 causes diaplay address counter 70 to increment from address location L2 to address location L3 as shown in the previous table. Display address counter 70 will then continue decrementing under control of line 64 such that at time D0 display 82 location E0 will display the data character located in position L0 of the display refresh buffer 80. Later on, when data key 7 is entered at keyboard matrix 10, it will be loaded into location L1 of refresh buffer 80 under control of load address counter 72. Also, display address counter 70 will be incremented by a signal on line 66 so that in the subsequent display cycle the character located at key position L1 in refresh buffer 80 will appear at display position E0 during D0 time from decoder 30, and the character located in refresh buffer 80 position L0 will appear at display position E1 during time D1 from decoder 30. The next key to be entered at keyboard matrix 10, a data character 9 will be loaded into refresh buffer 80 address location L2 under control of load address counter 72. Display address counter 70 will be incremented by line 66 such that during display, the data character located at refresh buffer 80 location L2 will appear at position E0 during D strobe time D0, the data character located at refresh buffer 80 address location L1 will appear during D strobe time D1 at display position E1, and the data characters located at refresh buffer L0 will appear at D strobe time D2 at display position E2.

By way of summary, the display 82 will display whatever is in one character buffer 76 at the display position E0-E7 gated on by line D0-D7 from decoder 30. Display address counter 70 is decremented and incremented in such a fashion as to place into character buffer 76 the appropriate character from locations L0-L7.

Figure 4:
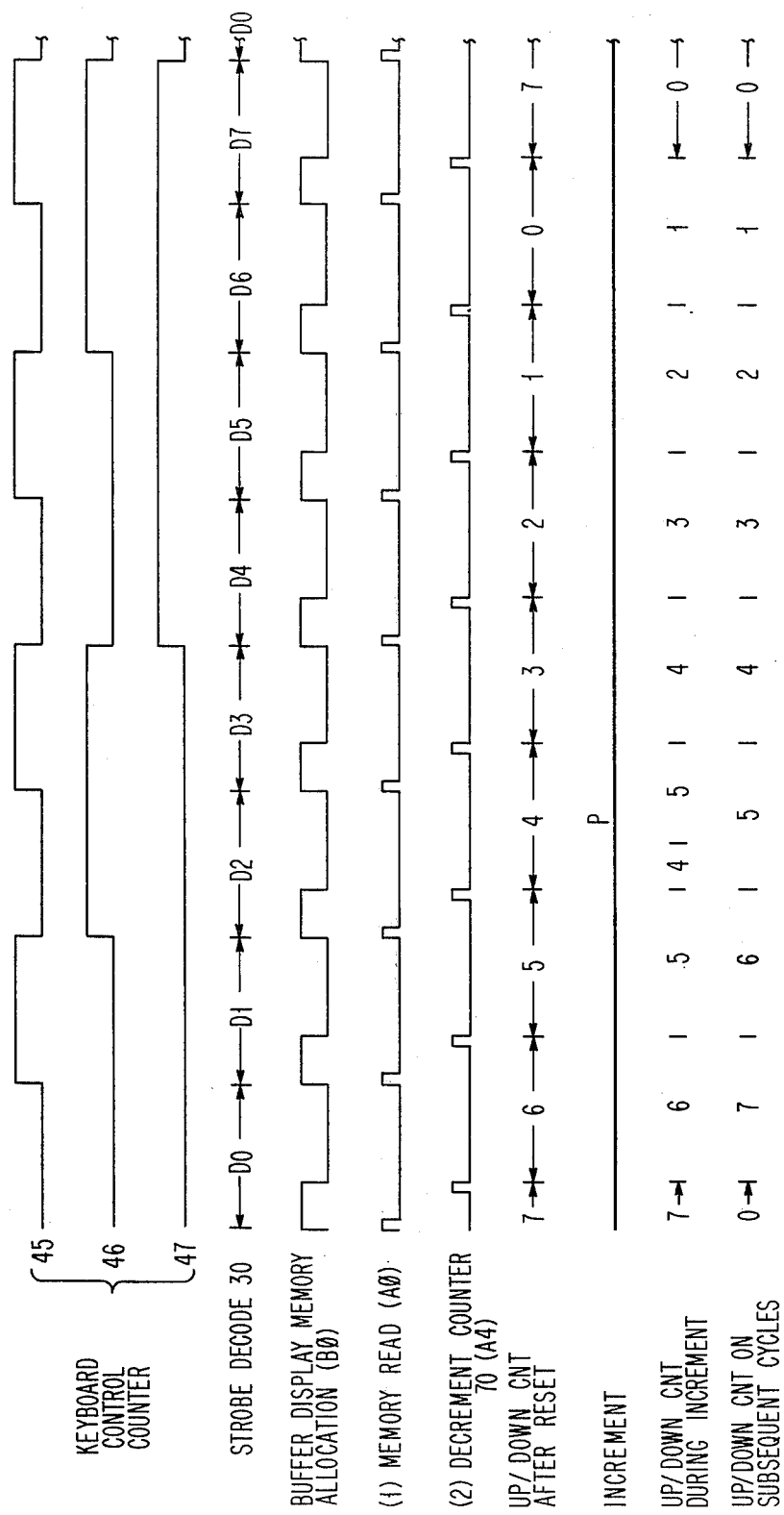
FIG. 4 is a timing chart illustrating storage address multiplexing and display counter synchronization.

Referring now to FIG. 4 in connection with FIG. 3, a description will be given of the time relationship governing the operation of the display subsystem. First, as noted above, the display address counter 70 is parallel loaded with reset pulse 81 with a value equal to the 7's complement of the continuously running control counter 16. This reset is only allowed to occur during the beginning of any buffer display memory allocation cycle which occurs at the beginning of every keyboard control count. Decrement of counter 70 then occurs at the end of every buffer memory allocation cycle. The 1'position of display address counter 70 is strictly a flip flop function on each successive decrement 64 or increment 66 pulse. The 2 and 4 positions of display address counter 70 are complemented during increment if the previous counter stages are off or during decrement if the previous counter stages are on. During normal operation one set/reset pulse 81 is sent to display address counter 70 to load the 7's complement of keyboard control counter 16, (this action does not reset counter 16) and then successive decrements are sent during the end of each buffer display cycle.

Initially, all 8 address positions of RAM display 80 are set to hex F characters (nothing displayed) by stepping the buffer load address counter 72 through all 8 counts while holding the input data line (not shown) to storage 80 active. Then the display address counter 70 continuously decrements through its 8 positions and displays these 8 characters from right to left, wraps around and repeats. Control counter 16 and display address counter 70 are synchronized at the start so that address position L7 is displayed at strobe D0 time. Then, with buffer load address counter 72 reset to zero at the start, the first character will be entered into address position L0 of storage RAM 80 and the buffer load address 72 and display address counter 70 will be incremented by one so that on the next cycle address position L0 will be synchronized with strobe D0. The second entry will cause address position L1 of the RAM 80 to be in synchronization with strobe D0, and so forth.

In the above described manner, keyboard entry and display are synchronized and optimum keyboard entry protective features implemented utilizing common timing controls, multiplexed storage addressing, and a minimum of logic controls to permit packaging of the control circuitry in a single chip.

While the invention has been particularly shown and described with reference to preferred embodiments thereof, it will be understood by those skilled in the art that the foregoing and other changes in form and details may be made therein without departing from the spirit and scope of the invention.

What is claimed is:

1. Keyboard entry and display apparatus, comprising:
   clock means for generating timing pulses;
   a plurality of refreshable display means, each for displaying a data character;
   display character buffer means for storing a representation of a character to be displayed;
   storage means, having an addressable storage location for each display means, for storing a plurality of data characters;
   display address counter means synchronously stepped responsive to said clock means for sequentially loading data characters from said storage means into said display character buffer means;
   control counter means responsive to said clock for generating a plurality of sequential control states;
   first decode means responsive to said control counter means for gating the display character buffer to said display means in a predetermined sequence;
   second decode means for synchronizing said control counter means and said display address counter means;
   keyboard means selectively operable for entering data;
   means including said first decode means for generating from the keyboard entered data a data character for storing in said storage means;
   load address counter means for addressing the keyboard entered data character into a next sequential storage location;
   means responsive to the loading of a data character into said storage means for stepping said load address counter means and for asynchronously stepping said display address counter means.

2. Display refresh means, comprising:
   storage means having a plurality of addressable data storage locations for storing data to be displayed;
   clock means for generating timing pulses;
   display address means synchronously driven by said clock means for sequentially retrieving data to be displayed from said storage means;
   control means synchronously driven by said clock means for gating retrieved data to sequential display elements and for establishing an initial correspondence between said display address counter means and said display elements;
   load means for loading data characters into sequential storage locations of said storage means and, with each said loading, for stepping the correspondence between said display address counter means and said display elements.

3. Keyboard entry apparatus for loading a display refresh store with data characters, comprising:
   clock means for generating timing pulses;
   control counter means driven by said clock means for generating a plurality of successive control states;
   a keyboard including a plurality of key means manually operable for entering data;
   scan means responsive to said control counter means for successively scanning the state of each key means and for providing a first signal when an operated key means is scanned;

buffer means responsive to said first signal for buffering the contents of said control counter means;

comparator means responsive to the second occurence of said first signal for comparing the timing states of said control counter means and said buffer means, and responsive to an equal comparison for loading the contents of said buffer means into a storage device.

4. The apparatus of claim 3, further comprising:

reset means responsive to said comparison means and said scan means for resetting said buffer means when said control counter means and said buffer means compare in the absence of said first signal.

5. The apparatus of claim 4, further comprising:

inhibit latch means set by said comparator means loading said buffer means into said storage device and reset by said reset means for inhibiting further loading of buffer means contents into said storage device.

6. A display refresh apparatus, comprising:

storage means having a plurality of addressable locations for storing data characters to be displayed;

display counter means synchronously driven by a clock for retrieving data characters from the storage locations;

means responsive to loading of a character into said storage means for asynchronously stepping said display counter means.

7. The display apparatus of claim 6 further comprising:

control counter means synchronously driven by said clock for gating said retrieved data characters to sequential display positions; and synchronizing means for establishing initial synchronization between said control counter means and said display counter means.

8. The display apparatus of claim 7 further comprising:

load address counter means multiplexed with said display counter means for addressing into said storage means data entered at a keyboard.

9. The display apparatus of claim 8 wherein said keyboard comprises a plurality of keyswitches logically arranged in a matrix array, and further comprising:

decoding means for decoding said control counter means to sequentially scan each key switch;

buffer means for buffering data from said control counter;

comparison means for comparing the control counter means and buffer means;

scan means responsive to said decoding means scanning an operated key switch for loading into said buffer means data from said counter means; and means responsive to said comparison means signaling correspondence between said control counter means and said buffer means when said scan means subsequently scans an operated key switch for loading the contents of said buffer means into said storage means.

* * * * *